(12) United States Patent
Thalmayr et al.

(10) Patent No.: US 9,537,466 B1
(45) Date of Patent: Jan. 3, 2017

(54) MICROELECTROMECHANICAL SYSTEM RESONATORS AND RELATED METHODS AND APPARATUS

(71) Applicant: Analog Devices, Inc., Norwood, MA (US)

(72) Inventors: Florian Thalmayr, Unterhaching (DE); Jan H. Kuypers, Rehau (DE); Andrew Sparks, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 761 days.

(21) Appl. No.: 13/873,906

(22) Filed: Apr. 30, 2013

Related U.S. Application Data

(60) Provisional application No. 61/641,523, filed on May 2, 2012.

(51) Int. Cl.
*H03H 9/08* (2006.01)
*H03H 9/09* (2006.01)
*H03H 9/15* (2006.01)
*H03H 9/25* (2006.01)
*B81B 7/00* (2006.01)

(52) U.S. Cl.
CPC ............... *H03H 9/25* (2013.01); *B81B 7/0077* (2013.01)

(58) Field of Classification Search
CPC .................................................. G01N 29/022
USPC ................. 310/313 A, 313 B, 313 C, 313 D, 313 R, 310/183–193, 311–371; 333/183–196
See application file for complete search history.

(56) References Cited

U.S. PATENT DOCUMENTS

| 5,025,346 | A | 6/1991 | Tang et al. |
| 8,058,769 | B2 | 11/2011 | Chen et al. |
| 9,299,910 | B1 * | 3/2016 | Sparks ................. H01L 41/053 |
| 2001/0033121 | A1 * | 10/2001 | Nguyen ................. 310/316.01 |
| 2003/0117237 | A1 | 6/2003 | Niu et al. |
| 2007/0013464 | A1 | 1/2007 | Pan et al. |
| 2007/0052498 | A1 | 3/2007 | Pan et al. |
| 2007/0188047 | A1 * | 8/2007 | Tanaka ..................... 310/313 D |

(Continued)

FOREIGN PATENT DOCUMENTS

| DE | 4419085 A1 * | 12/1994 | ............... H03H 9/05 |
| FR | 2734964 A1 * | 12/1996 | ............... H03H 9/05 |

(Continued)

OTHER PUBLICATIONS

Kaajakari et al., "Square-Extensional Mode Single-Crystal Silicon Micromechanical Resonator for Low-Phase-Noise Oscillator Applications," *IEEE Electron Device Letters* 25(4):173 (2004).

(Continued)

*Primary Examiner* — Thomas Dougherty
(74) *Attorney, Agent, or Firm* — Wolf, Greenfield & Sacks, P.C.

(57) ABSTRACT

Microelectromechanical systems (MEMS) resonators and related methods and apparatus are provided. A MEMS resonator may include a first portion and a second portion. The first portion may be configured to resonate, and the second portion may be configured to operate based on an energy trapping principle to prevent energy from traveling therethrough from the first portion. The MEMS resonator may be a Lamb wave resonator. The MEMS resonator may be anchorless. The MEMS resonator may have a side contacted by the anchor, wherein the anchor contacts greater than approximately 50% of the side.

20 Claims, 6 Drawing Sheets

(56) References Cited

U.S. PATENT DOCUMENTS

| | | | |
|---|---|---|---|
| 2008/0100176 A1* | 5/2008 | Haskell | G01H 11/08 |
| | | | 310/313 R |
| 2009/0315644 A1* | 12/2009 | Sheedy et al. | 333/186 |
| 2010/0171390 A1* | 7/2010 | Onoe | 310/320 |
| 2010/0314969 A1 | 12/2010 | Gaidarzhy et al. | |
| 2011/0266917 A1* | 11/2011 | Metzger et al. | 310/313 A |
| 2011/0279201 A1* | 11/2011 | Pensala | H03H 3/0076 |
| | | | 333/219.1 |
| 2012/0188023 A1* | 7/2012 | Rottenberg | H03H 9/02338 |
| | | | 331/156 |
| 2013/0140948 A1* | 6/2013 | Hirano et al. | 310/314 |

FOREIGN PATENT DOCUMENTS

| | | | | |
|---|---|---|---|---|
| JP | EP 1 221 727 A2 * | 7/2002 | | H01L 41/18 |
| SG | WO 2014 112951 A1 * | 7/2014 | | H03H 9/64 |
| WO | WO 2006/124303 | 11/2006 | | |

OTHER PUBLICATIONS

Khine et al., "7MHz length-extensional SOI resonators with T-shaped anchors," Solid-State Sensors, Actuators and Microsystems Conference: Transducers, Piscataway, NJ, US, Jun. 21, 2009.

Shockley et al., Energy Trapping and Related Studies of Multiple Electrode Filter Crystals. 17th Annual Symposium on Frequency Control. 1963;88-126. doi: 10.1109/FREQ.1963.201255.

Shockley et al., Trapped-Energy Modes in Quartz Filter Crystals. J Acoust Soc Am. 1967;41(4-2):981-93.

* cited by examiner

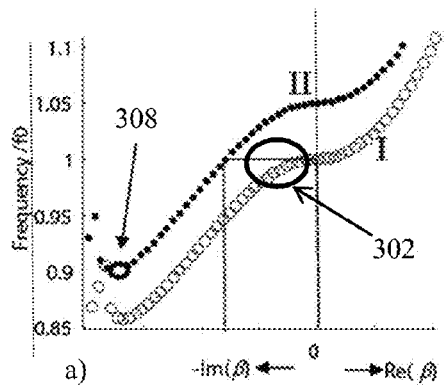 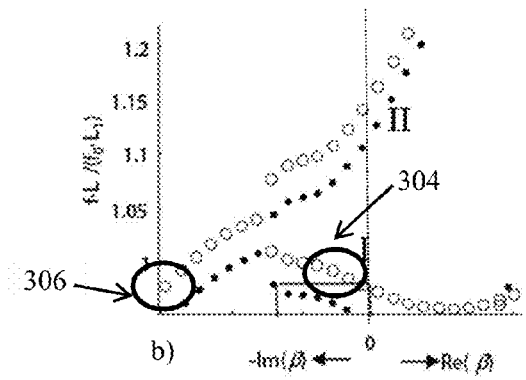
Figure 3A   Figure 3B
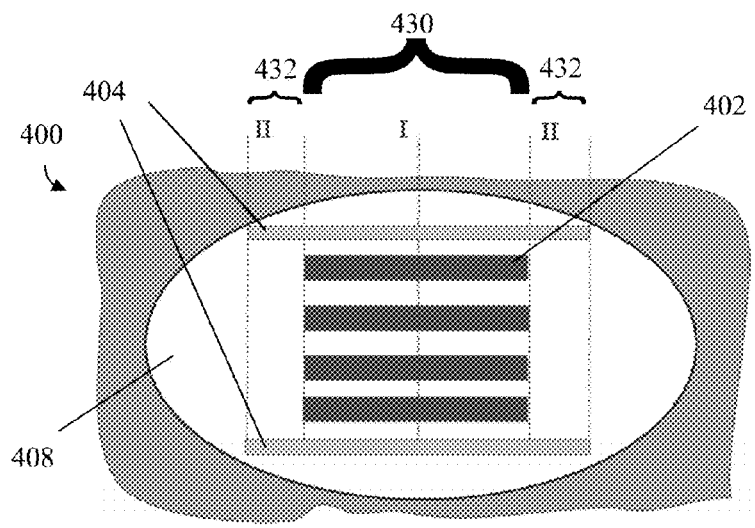
Figure 4

MICROELECTROMECHANICAL SYSTEM RESONATORS AND RELATED METHODS AND APPARATUS

CROSS-REFERENCE TO RELATED APPLICATIONS

This Application claims the benefit under 35 U.S.C. §119(e) of U.S. Provisional Application Ser. No. 61/641,523 entitled "MICROELECTROMECHANICAL SYSTEM RESONATORS AND RELATED METHODS AND APPARATUS" filed on May 2, 2012, which is hereby incorporated herein by reference in its entirety.

BACKGROUND

Field

The present application relates to an energy-trapping resonator, and to related apparatus and methods.

Related Art

Microelectromechanical systems (MEMS) are small mechanical structures with integrated electromechanical transducers to induce and/or detect their mechanical motion. MEMS resonators, such as MEMS Lamb wave resonators, may be used as resonators in oscillator circuits, acoustic frequency filters and for various acoustic sensors, such as gyroscopes, and temperature and chemical sensors Examples of MEMS devices include oscillators, accelerometers, gyroscopes, microphones, pressure sensors, switches, and filters.

Typically, a MEMS device is packaged with an integrated circuit (IC). The IC controls operation of the MEMS device, and can perform functions such as signal amplification, modulation and demodulation, conversion between analog and digital signal domains, and programmable compensation for manufacturing or operating variations.

Important performance metrics of resonators, such as piezoelectric Lamb wave resonators, include the quality factor of the vibration and the absence of spurious vibrations close to the resonance frequency of the resonator.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIG. 3A illustrates dispersion in regions I and II for type 1 dispersion in a Lamb wave resonator of the type illustrated in FIG. 2, according to a non-limiting embodiment.

FIG. 3B illustrates dispersion in region I and II for type 2 dispersion in a Lamb wave resonator of the type illustrated in FIG. 2, according to a non-limiting embodiment.

FIG. 4 illustrates a Lamb wave resonator according to an alternative non-limiting embodiment to that illustrated in FIG. 2.

SUMMARY

According to an aspect of the present application, an apparatus is provided, comprising a Lamb wave microelectromechanical systems (MEMS) Lamb wave resonator. The Lamb wave MEMS resonator comprises a first portion and a second portion, wherein the first portion is configured to resonate and wherein the second portion is configured to operate based on an energy trapping principle to prevent energy from traveling therethrough from the first portion.

According to another aspect of the present application, a device is provided comprising an anchorless microelectromechancial systems (MEMS) Lamb wave resonator.

According to an aspect of the present application, an apparatus is provided, comprising a substrate, a mechanical resonating structure, and an anchor coupling the mechanical resonating structure to the substrate. The mechanical resonating structure may have a side contacted by the anchor, and the anchor contacts greater than approximately 50% of the side.

DETAILED DESCRIPTION

Figure 1:
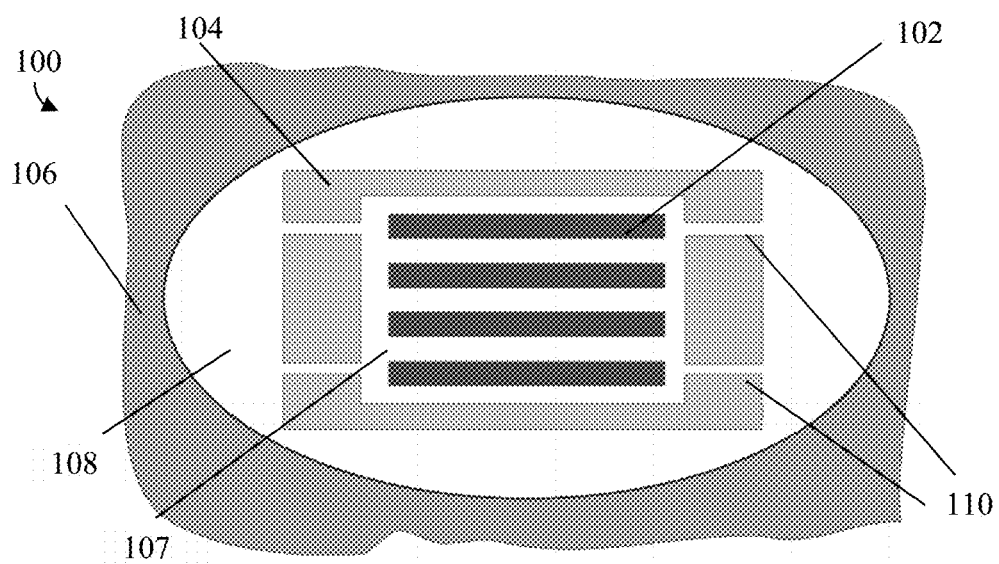
FIG. 1 illustrates a Lamb wave resonator having a resonating body coupled to a substrate by four anchors.

FIG. 1 illustrates a Lamb wave resonator 100, which is described further below. As shown, the Lamb wave resonator 100 is formed from a membrane 108 attached to a substrate 106. Four trenches 104 define the boundary of the Lamb wave resonator 100. Four anchors 110 couple the resonating body 107 to the substrate 106. Electric conductors (electrodes) 102 are formed on the resonating body 107 to actuate the resonating body 107 and/or sense vibration of the resonating body 107.

According to an aspect of the present application, Lamb wave resonators are described, which instead of using anchor suspension employ lateral energy trapping by geometric patterning in the direction perpendicular to the direction of vibration of the dominant mode of vibration of the plate. In some non-limiting embodiments, the Lamb wave resonator may be considered anchorless. In some such embodiments, the boundary of the mechanical resonating structure may be defined from a membrane by two trenches (and no more in some embodiments). The trenches may define at least two regions—a central resonating region and at least one side region, in which wave propagation drops off significantly.

According to another aspect of the present application, methods of manufacturing Lamb wave mechanical resonating structures are described. According to a non-limiting embodiment, a Lamb wave mechanical resonating structure may be formed by etching two trenches in a suspended membrane. The trenches may be configured to define a boundary of the Lamb wave mechanical resonating structure.

The various aspects described above, as well as further aspects, will now be described in further detail below. It should be appreciated that these aspects may be used alone, all together, or in any combination of two or more, to the extent that they are not mutually exclusive.

Some Lamb wave resonators 100 are freely vibrating substantially rectangular structures, which are connected laterally to surrounding peripherals and a substrate 106 by anchors 110, as depicted in FIG. 1. Vibration is intended to be in the up-down direction in FIG. 1, and therefore perpendicular to the electrodes 102. In such resonators 100, the design of the anchors 110 determines the performance metrics of the resonator 100, and especially the energy coupling from the central, freely resonating body 107 to the surrounding substrate 106. Patterning of the anchors 110 usually occurs by lateral etching of a membrane 108 bonded to a substrate 106. The anchors 110 are typically made as narrow as possible (in the up-down direction of FIG. 1) and positioned to contact the body at vibration nodes only so as not to impede vibration of the resonating body 107. Wider anchors 110 (i.e., anchors that are larger in the up-down direction of FIG. 1) are intrinsically disadvantageous as they damp the vibration of the body and therefore deteriorate the quality factor of resonance, Q.

Figure 2:
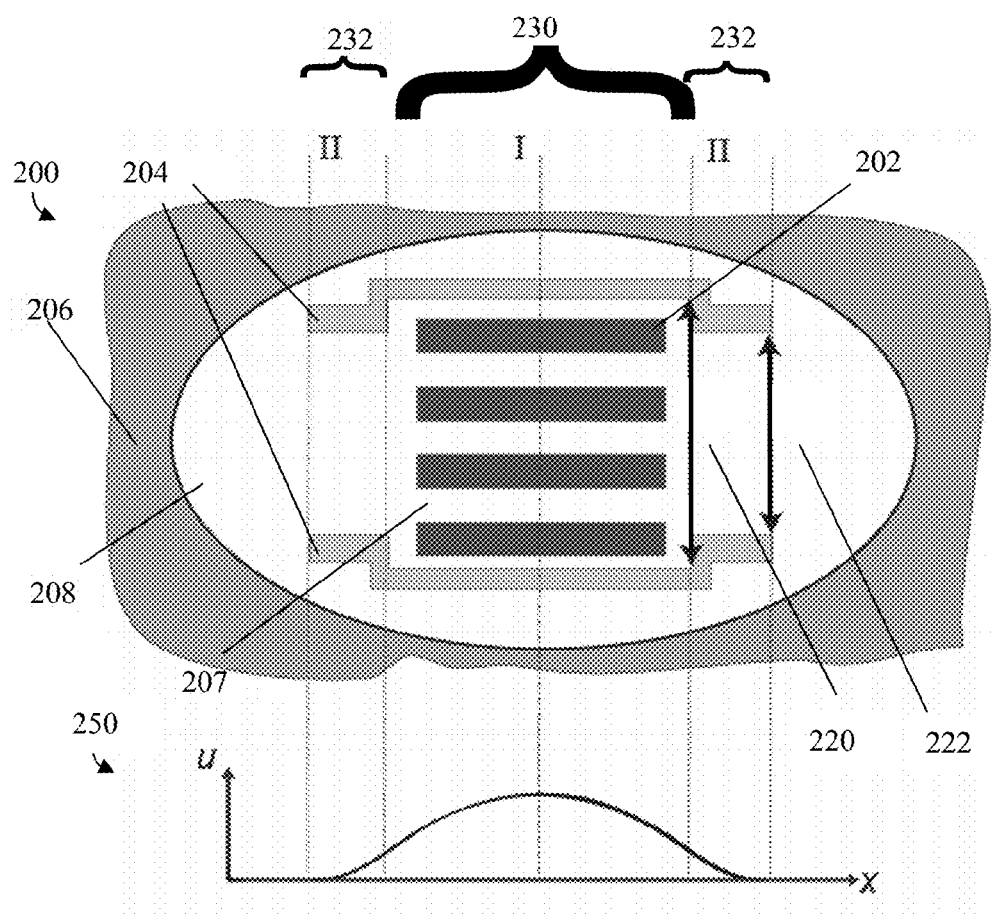
FIG. 2 shows a schematic of a Lamb wave resonator according to a non-limiting embodiment of the present application, and illustrates wave amplitude u in different regions of the Lamb wave resonator.

By contrast, according to an aspect of the present application, Lamb wave resonators are provided which do not utilize anchors of the type illustrated in FIG. 1. A non-limiting example according to a non-limiting embodiment is illustrated in FIG. 2. The illustrated device 200 includes a membrane 208 mounted to a substrate 206. Here, the membrane 208 may be a composition of multiple materials. According to a non-limiting embodiment, the membrane 208 may include, for example, a piezoelectric actuation layer. Thus, actuation of the resonator 200 may be piezoelectric in nature, and accordingly in some such non-limiting embodiments one or more appropriately patterned conduction layers (e.g., electrodes) 202 may be provided to excite a specific mode of resonance of the resonator 200. The resonator 200 of FIG. 2 may be configured to operate as an in-plane resonator, i.e., vibration may be in the plane of the membrane 208 rather than out of plane. Thus, the resonator 200 may also be referred to as a lateral mode resonator in some embodiments or a plate mode resonator.

The resonant area itself "in-plane" is defined by two appropriately shaped lateral trenches 204 perpendicular to (or substantially perpendicular to) the propagation direction of the main mode of vibration in the resonant region 207 on the upper and lower end of the resonant region 207 as shown in FIG. 2. In the following, the length direction of the trenches (left-right in the figure) is denoted as the x-direction and the perpendicular direction (up-down in the figure) as the y-direction, which is also the main direction of vibration.

The two trenches 204 may be configured to define sections (or portions) I (230) and II (232) with different effective resonance lengths, L1 (220) and L2 (222). These effective resonance lengths may be chosen so that the energy of the main resonance frequency is substantially trapped in region I (230) with regard to the x-direction. This means that the energy of the resonating body may be trapped (or confined) within the illustrated region I (230) by the following: reflection at the free out-of-plane boundaries (i.e., the top and bottom surfaces of the membrane 208 in region I (230), of which only the top surface is visible); reflection at the free in-plane boundaries (i.e., the boundaries represented by the trenches 204); and by energy trapping in the in-plane x-direction.

This latter energy trapping in-plane may be achieved by considering the specific dispersion of the resonance mode of interest with regard to the effective length in the different regions of the membrane 208. FIG. 3A shows the normalized dispersion as frequency length product f·L normalized to the frequency length product in region I of a type 1 dispersion mode propagating in the x-direction with wavenumber $\beta$. The normalized frequency length product f·L for a mode in a resonator of the type illustrated in FIG. 2 is shown for regions I (open circles) and II (closed circles). The x-axis represents the lateral wavenumber. Type 1 dispersion and type 2 dispersion (shown and described with respect to FIG. 3B) refer to the sign of $df/d(-Im(\beta))$, $\beta \rightarrow 0$. The type of dispersion (e.g., Type 1 v. Type 2) refers to the direction of the slope in the plots directly left of the zero crossings, i.e., the slopes of the plots within the circles 302 and 304). In FIG. 3A, the slope within the circle 302 has positive sign, which denotes type 1 dispersion. In FIG. 3B, the slope within the circle 304 is negative, which denotes type 2 dispersion.

The resonance frequency $f_0$ of the main resonance in the y-direction can be identified at substantially $\beta=0$. At the same frequency, $\beta$ in region II is negative imaginary, which means that the wave mode is evanescent; the wave amplitude is decaying exponentially and cannot transport energy except by tunneling through region II from region I to the outside membrane. As a result the energy is trapped in region I. The resulting wave amplitude 250 is illustrated in FIG. 2. The trapping effect and the decay of the wave amplitude 250 as $exp(-Im(\beta))$ are larger for larger $abs(Im(\beta))$.

However, the consideration of energy trapping holds true only if there occurs no significant scattering at the boundary between region I and region II. Scattering is stronger the more unalike the mode shapes of the modes in the different regions (regions I and II) are and the further apart the dispersion branches in region I and II. As can be seen in FIG. 3A there may be a certain f·L for region II, below which the branch does not exist anymore (denoted as bifurcation point (BF) 308). Below this point, scattering to other propagating wave modes becomes very strong and energy trapping may no longer be possible in some embodiments.

According to some non-limiting embodiments, energy trapping for type 1 dispersion may require that the dimension of region II in the direction substantially parallel to the main mode of vibration (e.g., the up-down direction in FIG. 2) is smaller than the dimension of region I in the same direction. In some non-limiting embodiments, this may be worded as a requirement that region II be thinner than region I to provide energy trapping with respect to type 1 dispersion.

FIG. 3B shows the normalized dispersion as frequency length product f·L normalized on the frequency length product in region I of a type 2 dispersion mode. In comparison to a type 1 dispersion mode, energy trapping cannot be achieved by a shorter plate, but (counter intuitively) the length of region II may need to be longer than region I.

According to some non-limiting embodiments, energy trapping for type 2 dispersion may require that the dimension of region II in the direction substantially parallel to the main mode of vibration (e.g., the up-down direction of FIG. 2) is larger than the dimension of region I in the same direction. In some non-limiting embodiments, this may be worded as a requirement that region II be thicker than region I to provide energy trapping with respect to type 2 dispersion.

According to a non-limiting embodiment, a resonator may be operated in a quasi-type 1 dispersion setting. For example, the electrodes of the resonating structure may impact dispersion. According to a non-limiting embodiment, a resonating structure otherwise configured to exhibit type 2 dispersion may, taking into account the electrodes in regions I and II, operate in a quasi-type 1 dispersion scenario, as noted by circle 306 in FIG. 3B.

It should be appreciated from the foregoing that in some embodiments region II may be considered a transition region. Region I may exhibit vibration of a desired type, while region II may exhibit decaying vibration.

It should be appreciated that the mechanical resonating structure 200 of FIG. 2, and according to the other aspects of the present application, may take any suitable dimensions. For example, according to a non-limiting embodiment, the width of region II (232) (i.e., the x-dimension direction of region II (232)) may be between approximately 15 microns and 200 microns, between approximately 30 microns and 150 microns, between approximately 40 microns and 100 microns, between approximately 60 microns and 80 microns, may be approximately 40 microns, approximately 50 microns, approximately 60 microns, or any other suitable width. The relative sizing of lengths L1 (220) and L2 (222) may take any suitable values. For example, according to a non-limiting embodiment, L2 (222) may be approximately equal to L1 (220), may be between approximately 70% of L1 and 110% of L1, may be between approximately 80% of L1 and 100% of L1, may be between approximately 85% and 95% of L1, may be approximately 85% of L1, approximately 90% of L1, approximately 95% of L1, or any other suitable value.

It should also be appreciated from FIG. A that according to at least one non-limiting embodiment, a boundary of a mechanical resonating structure 200 (e.g., a Lamb wave mechanical resonating structure) may be defined by a small number of trenches 204. For example, as illustrated, the boundary of a Lamb wave mechanical resonating structure may be defined by two (an in some cases only two) trenches 204.

Also, it should be appreciated from the foregoing discussion, as well as the further discussion to follow, that in at least some non-limiting embodiments, vibration of mechanical resonating structures may be limited to vibration in an intended direction (e.g., in the y-direction in FIG. 2). By contrast, conventional Lamb wave resonators exhibit at least some (unwanted) vibration in a secondary direction (e.g., in the x-direction of FIG. 1) which results from those unwanted spurious modes being trapped in the resonating structure. However, Lamb wave resonators according to one or more aspects of the present application may be substantially free of such unwanted secondary modes of vibration, either because such modes exhibit low coupling, low quality factor of vibration, or both. Thus, Lamb wave resonators according to one or more aspects of the present application may exhibit vibration substantially only in a desired direction.

Also, it should be appreciated that, in contrast to conventional Lamb wave resonators, one or more non-limiting embodiments of the present application may provide a Lamb wave resonator in which the resonating body is coupled to a substrate by a portion (e.g., region II) contacting the resonating body at both a node and anti-node of vibration of the resonating body. Stated another way, in some non-limiting embodiments the y-direction dimension of region II may be sufficiently long that it spans at least one node and at least one anti-node of vibration of the resonating body in the y-direction. In some non-limiting embodiments, the intersection between regions I and II may span more than 50% the length of region I in the y-direction.

According to an embodiment, an apparatus comprises a substrate, a mechanical resonating structure, and an anchor coupling the mechanical resonating structure to the substrate. The mechanical resonating structure has a side contacted by the anchor, and the anchor contacts greater than approximately 50% of the side. In a non-limiting embodiment, the anchor contacts greater than 75% of the side. In a non-limiting embodiment, the anchor contacts greater than approximately 85% of the side. In a non-limiting embodiment, the anchor contacts greater than approximately 95% of the side. In a non-limiting embodiment, the anchor contacts substantially the entire side. In a non-limiting embodiment, the anchor contacts less than approximately 115% of the side. In a non-limiting embodiment, the anchor has a varying dimension in a direction substantially parallel to the side, such that the anchor contacts substantially the entire side and then varies in dimension along a direction substantially perpendicular to the side. In a non-limiting embodiment, the anchor becomes narrower away from the contact between the anchor and the side. In a non-limiting embodiment, the change in anchor dimension is substantially continuous. In a non-limiting embodiment, the anchor becomes wider away from the contact between the anchor and the side.

According to a non-limiting embodiment, an apparatus is provided, comprising a substrate, a mechanical resonating structure, and an anchor coupling the mechanical resonating structure to the substrate. The mechanical resonating structure has a side contacted by the anchor, wherein the mechanical resonating structure is configured to exhibit primary vibration in a direction substantially parallel to the side, and wherein a dimension of the anchor parallel to the side of the mechanical resonating structure is greater than approximately 50% of the side. According to a non-limiting embodiment, the dimension of the anchor parallel to the side is a dimension of the anchor at an interface between the mechanical resonating structure and the anchor.

Further Considerations

Overall Effective Dispersion

FIG. 4 shows a schematic of a resonator 400 with trenches 404 designed for energy trapping by electrode dispersion shift (e.g., pure electrode dispersion shift). In addition to the length of the plate, the electrical conductor 402 and/or other layers confined to certain regions may change the dispersion of the main mode of vibration of the resonating structure. Thus, the impact of such layers of the resonating structure on overall effective dispersion of a wave mode is taken into account in at least some embodiments.

As an example, if a high density electrode material is used, the mass loading of the electrode material, together with the simple trench configuration illustrated in FIG. 4 may be suitable for causing sufficient energy trapping for a type 1 dispersion mode.

In contrast, if an electrode material with large propagation velocity of the desired wave mode is used, the resulting dispersion shift of the main mode of vibration in the electrode region (i.e., the region 430 of the resonating structure on which the electrode(s) 402 are disposed) may be suitable for energy trapping of a type 2 dispersion mode.

In general, it should be appreciated that the aspects described herein may apply to membranes of various types, including multi-layered membranes. For instance, the membranes 208 and 408 of FIGS. 2 and 4, respectively, may include multiple layers, including the illustrated electrodes (202 and 402, respectively), one or more active layers (e.g., a piezoelectric layer), and one or more additional layers operating as temperature compensation layers (e.g., to compensate temperature-induced variations in the resonance behavior of the mechanical resonating structure). Suitable multi-layered structures have been described in U.S. patent application Ser. No. 12/639,161, entitled "Mechanical Resonating Structures Including A Temperature Compensation Structure," filed on Dec. 16, 2009, now issued as U.S. Pat. No. 8,058,769 and incorporated herein by reference in its entirety. It should be appreciated that mechanical resonating structures as described herein may implement the multi-layered structures of the '161 application, but are not limited in this respect.

Geometric Transition from Region I to II

Figure 5:
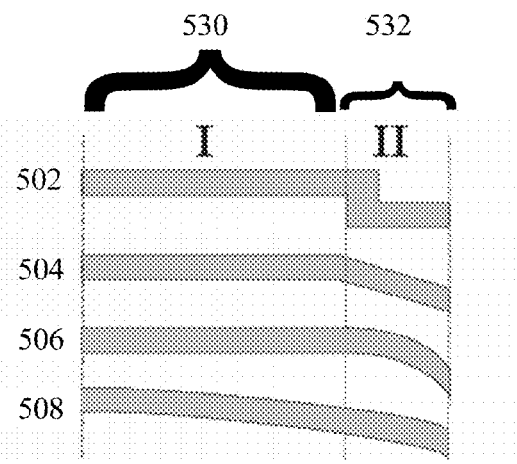
FIG. 5 illustrates multiple non-limiting examples of trench designs which may be used to form mechanical resonating structures according to an aspect of the present application.

FIG. 5 illustrates non-limiting examples of geometric transitions between region I (530) and region II (532). As noted above, to optimize the energy trapping behavior of a mechanical resonating structure according to one or more aspects of the present application, it may be (and in some cases is) necessary to minimize the wave scattering at the intersection between different regions (e.g., between regions I (230) and II (232) in FIG. 2, and between regions I (430) and II (432) in FIG. 4), while maximizing the amplitude decay in region II. In general, a large step transition from region I to region II is advantageous in terms of wave energy decay, while a small step is advantageous in terms of wave scattering. Thus, in some embodiments it may be undesirable to have the stepped transition 502 from region I (530) to region II (532) illustrated in FIG. 5. Instead, it may be desirable in at least some embodiments to have a continuous, smooth transition of the trench geometry from region I to II, minimizing the wave scattering. Non-limiting examples of smooth transitions 504, 506, and 508 are depicted in FIG. 5. In some non-limiting embodiments, the geometry of transition 504 may be preferred.

It should be noted that the possibility to optimize energy trapping by geometric shaping, as described herein according to non-limiting examples, is not a possibility for all resonator types. For example, it is not a possibility for energy trapping in BAW resonators and/or Quartz devices, where energy trapping is solely achieved by mass loading of an electrode.

Boundary Condition Optimization

Figure 6:
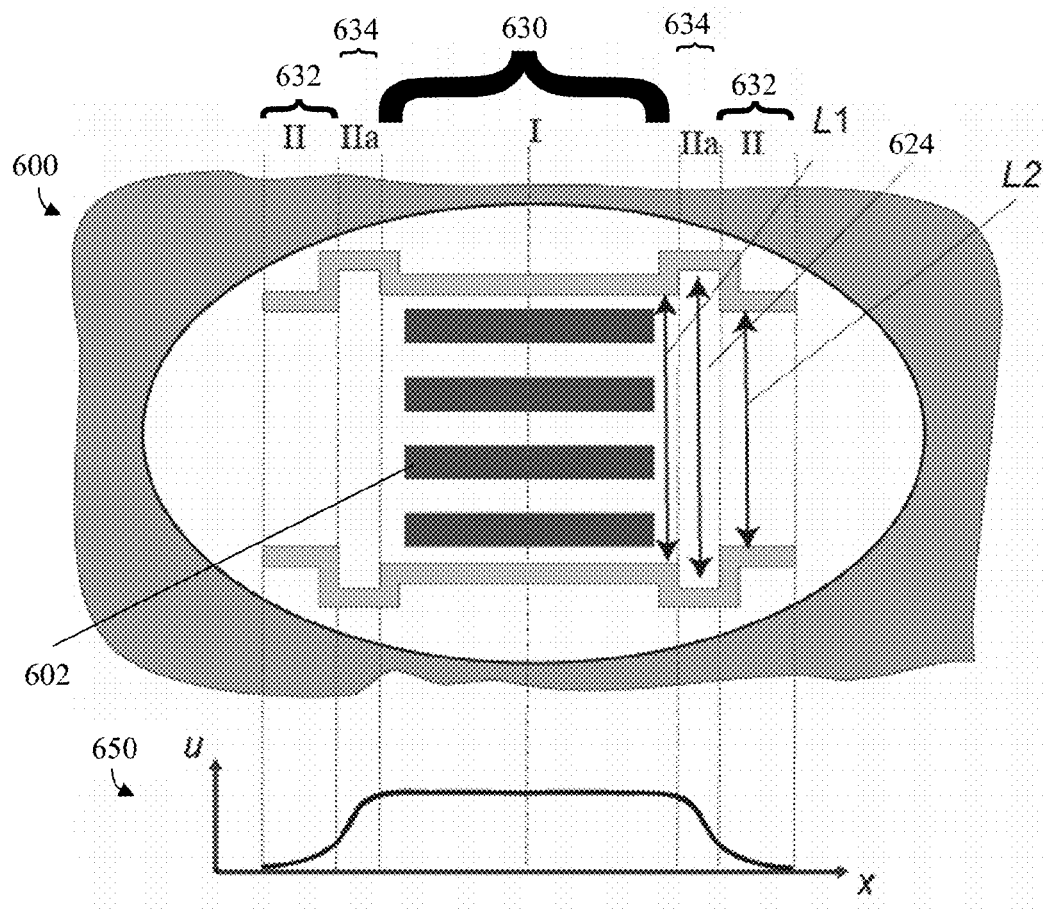
FIG. 6 shows a schematic of a mechanical resonating structure exhibiting boundary condition optimization, according to a non-limiting embodiment, and illustrates wave amplitude u in different regions of the mechanical resonating structure.

In embodiments in which a stepped transition between regions I and II is used, as shown in FIG. 2, the wave amplitude 250 varies u=u(x) over the width of the resonator 200, as shown in FIG. 2. It should be noted that in such embodiments u≠0 at the transition from region I to region II. In at least some embodiments, it may be desirable to optimize the boundary condition so that u=constant within region I and u→0 at the intersection to region II, where the wave number is imaginary and the wave is decaying. In some embodiments, it may be advantageous to adapt the boundary conditions between regions I and II with an additional region. A non-limiting example is illustrated in FIG. 6, which shows a schematic of a mechanical resonating structure 600 exhibiting boundary condition optimization, according to a non-limiting embodiment, and illustrates wave amplitude 650 $u$ in different regions of the mechanical resonating structure 600. According to one aspect of the present application, this results in a resonance of the main mode, which has: higher electromechanical coupling of the mode; better energy trapping, and therefore higher Q; and smaller form factor since the area needed for similar energy trapping can be smaller. The mechanical resonator 600 of FIG. 6 may be anchor-free.

For instance, for a type 1 dispersion wave mode, the additional region (e.g., region IIa (634) in FIG. 6) for optimizing the boundary conditions may be chosen so that the dispersion of the main mode in region IIa (634) has a real and positive wavenumber. In at least some embodiments, the width of this region 634 (in the x-direction) is then chosen so that W=$\lambda$/4=$\pi$/(2$\beta$), where W is the dimension in the x-direction. In some embodiments, the values of W and L2$a$ 624 for region IIa (634) may be chosen to have any given relationship with respect to each other to provide desired coupling behavior and Q.

For boundary condition optimization, the previously described considerations relating to overall effective dispersion and the geometric transition from region I 630 to region II 632 may have to be taken into account. For example, the mass loading of the electrodes 602 again shifts the dispersion in each region and/or the transition from region I to region IIa or from region IIa to region II may follow any suitable geometric shape minimizing the wave back scattering.

Figure 7:
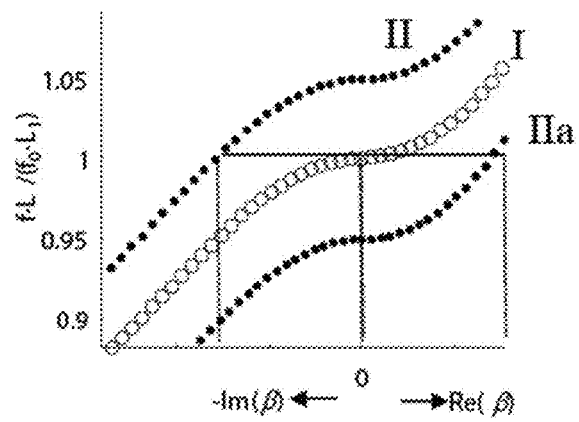
FIG. 7 illustrates dispersion of the main resonance mode in regions I, IIa and II of a mechanical resonating structure for the boundary condition optimized resonator design of FIG. 6, according to a non-limiting embodiment.

A non-limiting example of the dispersion in regions I, IIa and II for type 2 dispersion is illustrated in FIG. 7, for a device 600 of the type illustrated in FIG. 6.

Different Harmonic Boundary Conditioning

Figure 8:
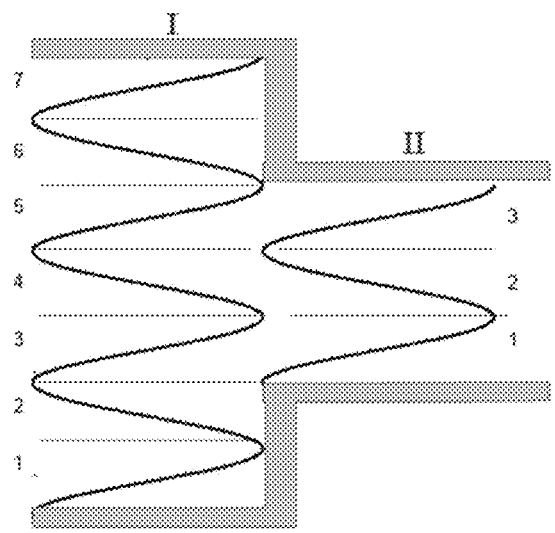
FIG. 8 illustrates matching of a 7th harmonic in region I with a 3rd harmonic in region II for a mechanical resonating structure according to a non-limiting embodiment.

It is also possible to choose the lengths L1 and L2 so that the matching is achieved with different overtones. This is illustrated in FIG. 8, where the n=7 harmonic in region I is matched with m=3 harmonic in region II. Note that both have the same wavelength in the main propagation direction.

Figure 9:
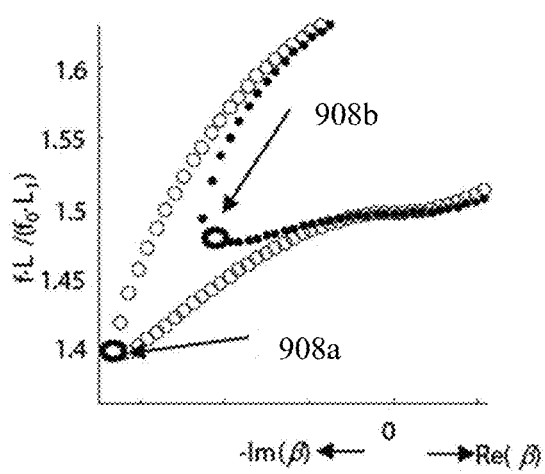
FIG. 9 illustrates dispersion of the main n=7 harmonic in region I and the m=3 harmonic in region II for a mechanical resonating structure according to a non-limiting embodiment.

This principle can be advantageous in terms of achieving the maximum energy decay rate as dispersion of different harmonics have different bifurcation points as shown in FIG. 9 (e.g., bifurcation point BFm denoted 908$a$, and bifurcation point BFn denoted 908$b$), where the m=1 harmonic usually does not have any dispersion at all. By exploiting the specific behavior of different harmonics, it is as a non-limiting example possible to obtain a higher decay constant as illustrated in FIG. 9.

Combination with Anchor Design

One or more of the above-described design principles may be employed, and combined in any suitable combination, to further boost the Q of a Lamb wave resonator, as a non-limiting example. Thus, according to a non-limiting embodiment, a mechanical resonating structure having regions I, IIa and II on a portion of a suspended membrane connected to a substrate by one or more anchors is provided.

The various aspects of the present application may provide various benefits. Following are some non-limiting examples of benefits. It should be appreciated that not every benefit may be provided by every aspect, and that at least some of the aspects may provide benefits not explicitly listed here. Thus, the various aspects are not limited to providing the following benefits.

One or more aspects may allow for simple geometric design of a mechanical resonating structure. Such simple designs may simplify manufacturing, and may result in smaller variation of resonator performance metrics between resonators formed on different wafers and between resonators formed on a single wafer, i.e., within-wafer variation. As a non-limiting example, Q (quality factor) of resonators may be more stable across wafers (i.e., between resonators formed on different wafers) and within wafers than possible using conventional resonator designs.

One or more aspects may allow for substantially rigid mechanical resonating structures, including substantially rigid Lamb wave resonators. The rigidity may have various benefits, including device resilience and improved vibration sensitivity, among others.

One or more aspects may allow for suppression of spurious plate vibrations. For example, lateral modes of vibration may be strongly suppressed as reflection in the width direction of the mechanical resonating structure may be eliminated (or substantially eliminated).

One or more aspects may provide mechanical resonating structures exhibiting better electromechanical coupling of the main mode of vibration. A higher value of Q may be achieved and a lower motional resistance Rm for a given value of Q compared to that of conventional mechanical resonating structures may also be achieved.

One or more aspects of may provide mechanical resonating structures which are substantially insensitive to external vibration (e.g., environmental vibration or mechanical noise). Rigid device designs may facilitate such characteristics of behavior.

One or more aspects may provide mechanical resonating structures exhibiting improved thermal behavior compared to conventional mechanical resonating structures. For example, a smaller thermal time constant may be provided. Moreover, one or more aspects may provide mechanical resonating structures exhibiting high power durability.

Mechanical resonating structures formed in accordance with one or more aspects of the present application may be completely self-aligning and symmetric. Such characteristics may result in substantial suppression of spurious modes of vibration, which may be beneficial in at least some embodiments.

Mechanical resonating structures according to one or more aspects of the present application may exhibit better stress behavior than conventional mechanical resonating structures, for example because lateral mode coupling may be substantially suppressed.

One or more aspects of the present application may allow for additional sensors and (thermal) actuators/heaters to be implemented in close proximity to the mechanical resonating structure. Thus, integration of mechanical resonating structures with sensors and actuators/heaters may be facilitated.

One or more aspects of the present application may provide mechanical resonating structures (e.g., Lamb wave mechanical resonating structures) in which a main resonance mode has a purely longitudinal character perpendicular to the direction of one or more trenches used to define a boundary of the resonating structure.

Again, it should be appreciated that the above-described examples of benefits provided by one or more aspects of the present application are non-limiting, and that additional and/or alternative benefits are also possible.

One or more aspects of the present application may find application in various types of devices and industries. For example, one or more aspects may be used in connection with radio frequency (RF) filters and duplexers, sensors, oscillator and timing products, temperature stabilized resonators, cellular phones, wireless devices and systems, Bluetooth technology, video cameras, video players, personal digital assistants (PDAs), personal computers, military platforms, vehicles, airplanes, PNDs, laptops, music players, tablet computers, and oven-controlled mechanical oscillators (OCMO). These, however, are non-limiting examples.

According to an aspect of the present application, a device is provided comprising a substrate, a substantially planar membrane mounted to the substrate, and an acoustic resonator, which is defined by two trenches in the membrane.

In some embodiments, the acoustic resonator is actuated piezoelectrically.

In some embodiments, the main mode of vibration of the acoustic resonator is substantially a Lamb wave.

In some embodiments, the Lamb wave is substantially a thickness extensional mode.

In some embodiments, the trenches are perpendicular to the propagation direction of the main mode of resonance of the acoustic resonator.

In some embodiments, the acoustic vibration occurs in a limited region of the membrane only.

In some embodiments, the confinement of the acoustic vibration is achieved by adding/subtracting material on limited parts of/from the membrane.

In some embodiments, adding/subtracting material changes the mechanical properties of the membrane locally.

In some embodiments, the confinement of the acoustic vibration is achieved by geometric shaping of the trenches.

In some embodiments, the confinement of the acoustic vibration is achieved by combination of geometric shaping of the trenches and adding/subtracting material on limited parts of/from the membrane.

In some embodiments, the confinement is achieved by the main mode of resonance having a real positive wavenumber perpendicular to the main vibration direction (lateral wavenumber) or a lateral wavenumber substantially 0 in the region of the acoustic resonance, and the lateral wavenumber of the main mode of resonance having a negative imaginary part at least in part of the membrane In some embodiments, the region of the acoustic resonance is adjacent to the membrane region, and the acoustic mode of resonance has a wavenumber with negative imaginary part.

In some embodiments, there is at least one part of the membrane in between the region of the acoustic resonance and the membrane region, and the acoustic resonance has a wavenumber with negative imaginary part.

In some embodiments, the main mode of resonance in at least one region between the acoustic resonance membrane region and the membrane region with lateral wave number with negative imaginary part, has a positive real lateral wave number.

In some embodiments, the confinement is achieved by the main mode of resonance having a real positive lateral wavenumber or a lateral wavenumber substantially 0 in the region of the acoustic resonance, and a mode with substantially similar wavenumber in main propagation direction as the main mode ("matching mode") having a negative imaginary part of the lateral wavenumber in at least in part of the membrane.

In some embodiments, the region of the acoustic resonance is adjacent to the membrane region, and the matching mode has a lateral wave number with negative imaginary part.

In some embodiments, there is at least one part of the membrane in between the region of the acoustic resonance and the membrane region of the matching mode.

In some embodiments, the trenches are shaped to allow continuous transition from the acoustic resonance region to and within the membrane region, where the imaginary part of the lateral wavenumber is negative.

According to another aspect of the present application, a device is provided comprising an anchorless microelectromechanical systems (MEMS) Lamb wave resonator.

In some embodiments, the anchorless MEMS Lamb wave resonator comprises a suspended membrane having two trenches formed therethrough, the two trenches defining a boundary of the MEMS Lamb wave resonator.

In some embodiments, the suspended membrane comprises a piezoelectric material.

In some embodiments, the suspended membrane comprises an active layer and one or more additional layers configured to compensate for temperature-induced variation in resonant behavior of at least the active layer.

In some embodiments, the one or more additional layers comprises a multi-layer stack of material, wherein a first layer of the multi-layer stack of materials comprises a material whose stiffness increases with increasing temperature and wherein a second layer of the multi-layer stack of materials comprises a material whose stiffness decreases with increasing temperature.

In some embodiments, the device further comprises an electrode formed on the suspended membrane.

In some embodiments, the electrode is an interdigitated (IDT) electrode.

In some embodiments, the anchorless MEMS Lamb wave resonator comprises a suspended membrane having at least two trenches formed therethrough, wherein exactly two trenches define a boundary of the MEMS Lamb wave resonator.

According to another aspect of the present application, there is provided an apparatus comprising a microelectromechanical systems (MEMS) Lamb wave resonator comprising a first portion and a second portion, wherein the first portion is configured to resonate and wherein the second portion is configured to operate based on an energy trapping principle to prevent energy from traveling therethrough from the first portion.

In some embodiments, the first and second portions are part of a suspended membrane coupled to a substrate.

In some embodiments, the second portion is configured to prevent energy in the first portion from reaching the substrate.

In some embodiments, the Lamb wave MEMS resonator further comprises a third portion, wherein the second portion is adjacent a first side of the first portion and the third portion is adjacent a second side of the first portion, and wherein each of the second and third portions is configured to prevent energy in the first portion from reaching the substrate.

According to another aspect of the present application, there is provided an apparatus comprising a substrate; a mechanical resonating structure; and an anchor coupling the mechanical resonating structure to the substrate, wherein the mechanical resonating structure has a side contacted by the anchor, and wherein the anchor contacts greater than approximately 50% of the side.

In some embodiments, the anchor contacts greater than 75% of the side.

In some embodiments, the anchor contacts greater than approximately 85% of the side.

In some embodiments, the anchor contacts greater than approximately 95% of the side.

In some embodiments, the anchor contacts substantially the entire side.

In some embodiments, the anchor contacts less than approximately 115% of the side.

In some embodiments, the anchor has a varying dimension in a direction substantially parallel to the side, such that the anchor contacts substantially the entire side and then varies in dimension along a direction substantially perpendicular to the side.

In some embodiments, the anchor becomes narrower away from the contact between the anchor and the side.

In some embodiments, the change in anchor dimension is substantially continuous.

In some embodiments, the anchor becomes wider away from the contact between the anchor and the side.

In some embodiments, the mechanical resonating structure is configured to exhibit vibration in a direction substantially parallel to the side, and the contact between the side and the anchor spans a node and an anti-node of the vibration.

According to another aspect of the present application, there is provided an apparatus comprising a substrate; a mechanical resonating structure; and an anchor coupling the mechanical resonating structure to the substrate, wherein the mechanical resonating structure has a side contacted by the anchor, wherein the mechanical resonating structure is configured to exhibit primary vibration in a direction substantially parallel to the side, and wherein a dimension of the anchor parallel to the side of the mechanical resonating structure is greater than approximately 50% of the side.

In some embodiments, the dimension of the anchor parallel to the side is a dimension of the anchor at an interface between the mechanical resonating structure and the anchor.

According to another aspect of the present application, there is provided a method of manufacturing a mechanical resonating structure, the method comprising forming a suspended membrane, and forming first and second trenches in the suspended membrane defining a boundary of the mechanical resonating structure.

In some embodiments, forming the first and second trenches comprises forming the first and second trenches to be substantially parallel to each other.

In some embodiments, forming the first and second trenches comprises forming the first and second trenches through multiple layers.

In some embodiments, forming the suspended membrane comprises bonding a multi-layer stack to a substrate.

In some embodiments, the multi-layer stack comprises an active layer and one or more additional layers.

In some embodiments, the active layer comprises a piezoelectric material.

In some embodiments, the method further comprises forming one or more electrodes on the suspended membrane.

It should be understood that the various embodiments shown in the Figures are illustrative representations, and are not necessarily drawn to scale. Reference throughout the specification to "one embodiment" or "an embodiment" or "some embodiments" means that a particular feature, structure, material, or characteristic described in connection with the embodiment(s) is included in at least one embodiment, but not necessarily in all embodiments. Consequently, appearances of the phrases "in one embodiment," "in an embodiment," or "in some embodiments" in various places throughout the Specification are not necessarily referring to the same embodiment.

Unless the context clearly requires otherwise, throughout the disclosure, the words "comprise," "comprising," and the like are to be construed in an inclusive sense as opposed to an exclusive or exhaustive sense; that is to say, in a sense of "including, but not limited to." Additionally, the words "herein," "hereunder," "above," "below," and words of similar import refer to this application as a whole and not to any particular portions of this application. When the word "or" is used in reference to a list of two or more items, that word covers all of the following interpretations of the word:

any of the items in the list; all of the items in the list; and any combination of the items in the list.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

The invention claimed is:

1. An apparatus, comprising:
a substrate;
a mechanical resonating structure having a side with a first length; and
an anchor coupling the mechanical resonating structure to the substrate and having a first end contacting the side and a second end contacting the substrate,
wherein the anchor is laterally patterned such that a second length of the first end differs from and is greater than approximately 50% of the first length.

2. The apparatus of claim 1, wherein the anchor is laterally patterned such that the second length is greater than 75% of the first length.

3. The apparatus of claim 2, wherein the anchor is laterally patterned such that the second length is greater than approximately 85% of the first length.

4. The apparatus of claim 3, wherein the anchor is laterally patterned such that the second length is greater than approximately 95% of the first length.

5. The apparatus of claim 1, wherein the mechanical resonating structure is configured to exhibit vibration in a direction substantially parallel to the side, and wherein the contact between the side and the anchor spans a node and an anti-node of the vibration.

6. The apparatus of claim 1, wherein the anchor has a varying lateral dimension in a direction substantially parallel to the side, such that the anchor contacts substantially the entire side and then varies in dimension along a direction substantially perpendicular to the side.

7. The apparatus of claim 6, wherein the anchor becomes narrower away from the contact between the anchor and the side.

8. The apparatus of claim 7, wherein the varying lateral dimension varies substantially continuously.

9. The apparatus of claim 6, wherein the anchor becomes wider away from the contact between the anchor and the side.

10. The apparatus of claim 1, wherein the mechanical resonating structure is configured to exhibit primary vibration in a direction substantially parallel to the side.

11. A device, comprising:
a suspended microelectromechancial systems (MEMS) resonator body configured to support a primary mode of vibration in a first direction; and
means for confining energy within the suspended MEMS resonator body by evanescent decay of the primary mode in a direction different than the first direction.

12. The device of claim 11,
wherein the suspended MEMS resonator body comprises a suspended membrane having two trenches formed therethrough, the two trenches defining a boundary of the suspended MEMS resonator body.

13. The device of claim 12, wherein the suspended membrane comprises an active layer and one or more additional layers configured to compensate for temperature-induced variation in resonant behavior of at least the active layer.

14. The device of claim 13, wherein the one or more additional layers comprises a multi-layer stack of materials, wherein a first layer of the multi-layer stack of materials comprises a material whose stiffness increases with increasing temperature and wherein a second layer of the multi-layer stack of materials comprises a material whose stiffness decreases with increasing temperature.

15. The device of claim 11,
wherein the suspended MEMS resonator body comprises a suspended membrane having at least two trenches formed therethrough, wherein exactly two trenches define a boundary of the suspended MEMS resonator body.

16. An apparatus, comprising:
a microelectromechanical systems (MEMS) Lamb wave resonator comprising a first portion and a second portion, wherein the first portion is configured to resonate and wherein the second portion is laterally patterned to operate based on an evanescent decay energy trapping principle to limit energy from traveling therethrough from the first portion.

17. The apparatus of claim 16, wherein the first and second portions are part of a suspended membrane coupled to a substrate.

18. The apparatus of claim 17, wherein the MEMS Lamb wave resonator further comprises a third portion that is part of the suspended membrane, with the second portion being positioned between the first and third portions, and wherein the second portion has a greater lateral dimension than the third portion.

19. The apparatus of claim 17, wherein the MEMS Lamb wave resonator further comprises a third portion, wherein the second portion is adjacent a first side of the first portion and the third portion is adjacent a second side of the first portion, and wherein each of the second and third portions is laterally patterned to limit energy in the first portion from reaching the substrate.

20. The apparatus of claim 16, wherein the first and second portions have different lateral dimensions, and wherein a lateral dimension of the second portion varies substantially continuously over at least part of a length of the second portion.

* * * * *